US006719568B2

(12) United States Patent
Fujimoto et al.

(10) Patent No.: US 6,719,568 B2
(45) Date of Patent: Apr. 13, 2004

(54) ELECTRIC CIRCUIT UNIT

(75) Inventors: Takeshi Fujimoto, Osaka (JP); Hiromi Nakanishi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/320,626

(22) Filed: Dec. 17, 2002

(65) Prior Publication Data

US 2003/0124913 A1 Jul. 3, 2003

(30) Foreign Application Priority Data

Dec. 19, 2001 (JP) .................................... 2001-385801

(51) Int. Cl.⁷ .............................................. H01R 12/00
(52) U.S. Cl. ......................................... 439/65; 439/74
(58) Field of Search ............................. 439/65, 74, 61, 439/62

(56) References Cited

U.S. PATENT DOCUMENTS

| 5,211,565 A | * | 5/1993 | Krajewski et al. ............. 439/65 |
| 5,907,475 A | * | 5/1999 | Babinski et al. ............... 439/65 |
| RE36,916 E | * | 10/2000 | Moshayedi ................... 439/65 |

FOREIGN PATENT DOCUMENTS

JP          06-120636          4/1994

* cited by examiner

*Primary Examiner*—Tho D. Ta
(74) *Attorney, Agent, or Firm*—McDermott, Will & Emery

(57) ABSTRACT

The electric circuit unit has a module having an electric or optical signal processing function. Between two parallel circuit boards, the module is bonded thereto and has an electric connection structure or an optical connection structure. This provides a small-size electric circuit unit with component elements mounted at high density.

9 Claims, 7 Drawing Sheets

ELECTRIC CIRCUIT UNIT

This application is based on the application No. 2001-385801 filed in Japan, the content of which is incorporated hereinto by reference.

BACKGROUND OF THE INVENTION

1. Field of the Invention

The present invention relates to an electric circuit unit for connecting a plurality of circuit boards to one another. This electric circuit unit is widely used for an information processing unit such as a computer, an electric/optical information communication unit, an image display unit, or the like.

2. Description of Related Art

A connector or cable is conventionally used for connecting a plurality of circuit boards to one another.

In the inter-board connection structure of the type above-mentioned, a signal processing function cannot be given to the connection structure such as a connector or cable by mounting electronic/electric circuit elements and/or optical circuit elements on the connection structure itself.

There has been proposed an example in which a plurality of parallel boards are connected to one another with a board disposed at right angles thereto (Japanese Patent Laid-Open Publication No. H6-120636).

To provide this orthogonal board with a signal processing function, electronic/electric circuit elements and/or optical circuit elements can be disposed thereon. However, since discrete elements are mounted on the board, the mounting density is lowered to prevent the whole electric circuit unit from being made in a compact design.

BRIEF SUMMARY OF THE INVENTION

According to the present invention, an electric circuit unit uses apart (hereinafter referred to as "module") formed by resin-molding (i) a lead frame on which electric circuit elements and/or optical circuit elements are mounted, (ii) and/or a circuit board on which electric circuit elements and/or optical circuit elements are mounted (hereinafter referred to as "lead frame or the like"), the terminals of the lead frame or the like being exposed outside from the molded body.

In the electric circuit unit according to the present invention, the module incorporating electric or optical circuit elements is bonded to and between the circuit boards such that the circuit boards are electrically or optically connected to each other. This achieves high-density mounting, enabling the electric circuit unit to be made in a compact design.

It was not possible to provide a conventional connector for connecting the circuit boards to one another with an optical connection function. According to the present invention, however, the optical connection can also be made.

Examples of the electric circuit element include an integrated circuit, an individual semiconductor element, a capacitor, a resistor, an inductance, a filter, a switch and the like.

Examples of the optical circuit element include a light emitting element, a light receiving element, a Si platform, a lens, a waveguide, an optical fiber, an optical filter, a photonic crystal and the like.

The module maybe provided, on its end face not connected to any of the circuit boards, with an electric or optical connection structure for connecting the module to an external device. According to the arrangement above-mentioned, the module can directly be connected to an external device. There may be disposed a plurality of external-device connection structures.

The circuit boards are disposed at an optional angle, and may be disposed for example at an angle 0° (parallel) or 90° (orthogonal) with respect to one another. When the circuit boards are disposed at an angle 0°, the circuit boards are horizontally disposed and connected to one another with modules.

The characteristic impedance of the electric signal wirings inside of the module can be set to 50Ω by adjusting parameters of the wirings (signal lines, ground lines, insulating material) or the like.

The following description will discuss specific arrangements of the present invention with reference to the attached drawings.

DESCRIPTION OF THE PREFERRED EMBODIMENTS

Figure 1:
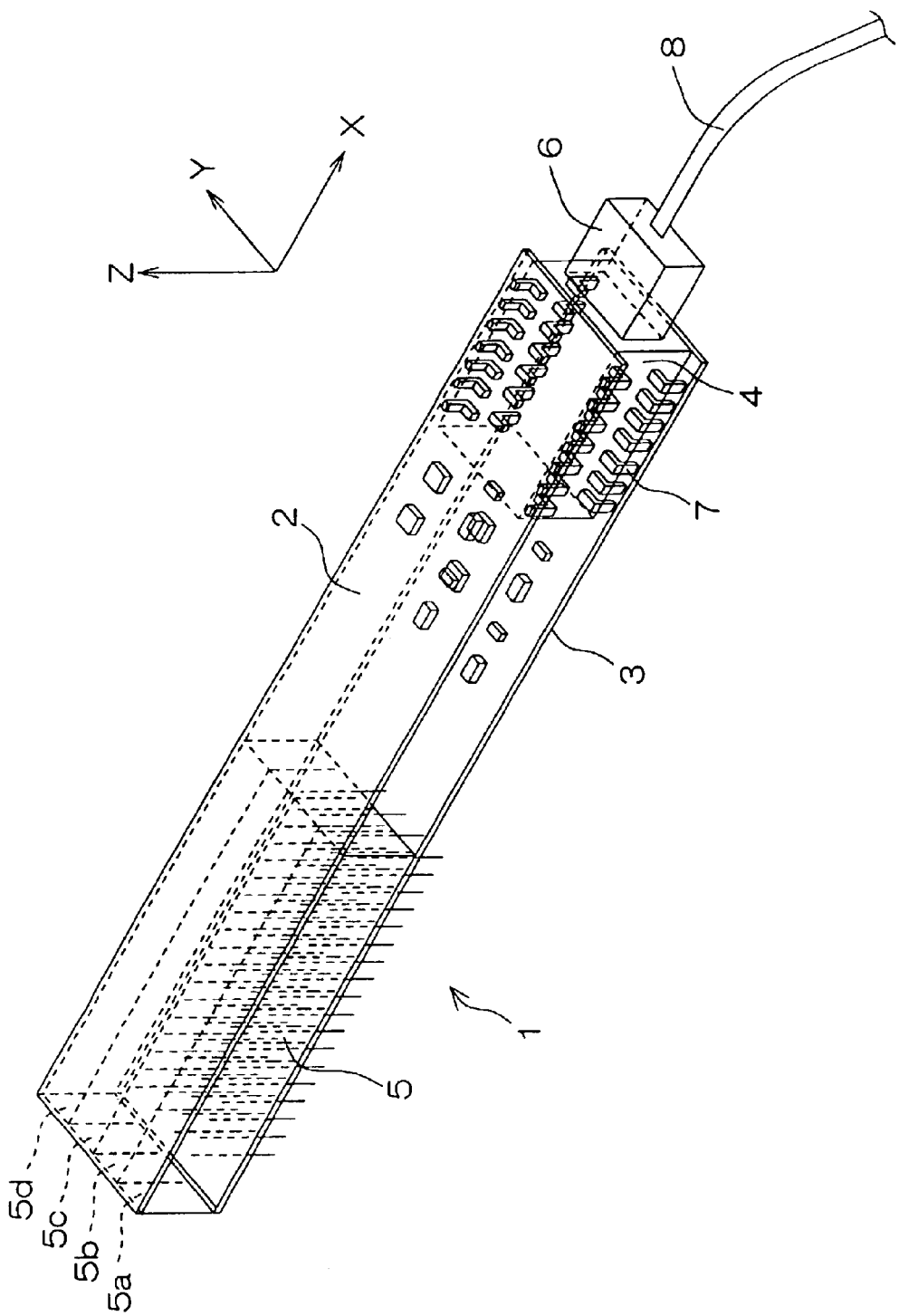
FIG. 1 is a perspective view of an optical transmitting and receiving circuit unit 1 according to an embodiment of the present invention.
Figure 2:
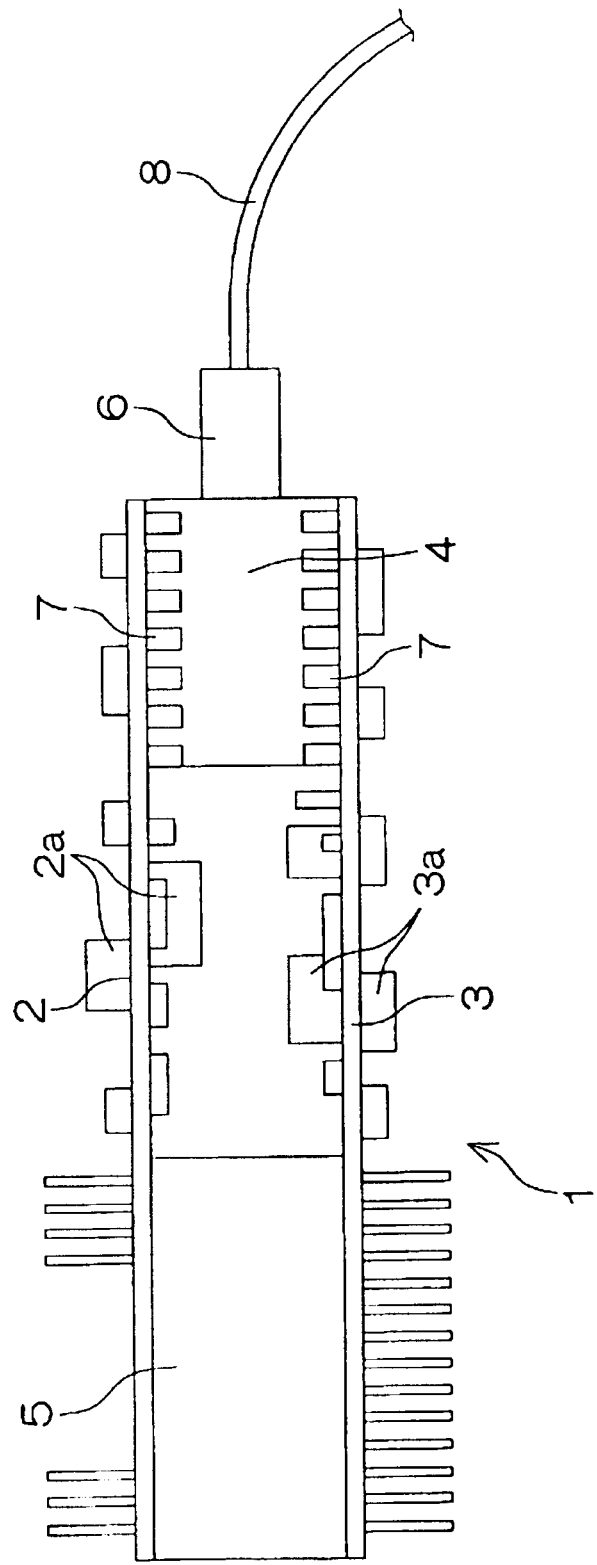
FIG. 2 is a side view of the optical transmitting and receiving circuit unit 1 in FIG. 1.

FIG. 1 is a perspective view of an optical transmitting and receiving circuit unit 1 as an example of an electric circuit unit of the present invention, and FIG. 2 is a side view of FIG. 1.

In the optical transmitting and receiving circuit unit 1, transmitting and receiving circuit boards 2, 3 disposed in parallel to each other, are electrically connected to each other by two modules 4, 5.

Out of the two modules 4, 5, the front module 4 is arranged to achieve conversion between an electric signal and an optical signal. The front module 4 is provided, on its front end face (which is seen in the direction X in FIG. 1) which is not connected to any of the circuit boards 2 and 3, with an optical connector 6 for optically connecting the front module 4 to an external device.

In the front module 4, electric circuit elements such as ICs, resistors, capacitors and the like are mounted on a lead frame or the like, and optical circuit elements such as light emitting/receiving elements, Si platforms, waveguides and the like are mounted on a lead frame or the like. The front module 4 is subjected to transfer-molding with resin, and terminals 7 of the lead frame or the like are exposed outside from the left and right lateral sides (which are seen in the ±Y directions in FIG. 1). The terminals 7 of the lead frame or the like are bent, and soldered and fixed to pattern electrodes of the transmitting and receiving circuit boards 2, 3.

The front module 4 is provided, on its end face not connected to any of the circuit boards 2 and 3, with the single optical connector 6 for optically connecting the front module 4 to an external device. However, the front module 4 may be provided on this end face with a plurality of optical connectors. Further, the front module 4 may be provided on each of a plurality of end faces thereof with an optical connector for optically connecting the front module 4 to an external device.

The upper circuit board is the transmitting circuit board 2 having thereon transmitting circuits 2a for four channels as shown in FIG. 2. The lower circuit board is the receiving circuit board 3 having thereon receiving circuits 3a for four channels.

The rear module 5 is arranged to perform an input/output interface function of transmitting and receiving signals, and comprises four sub-modules 5a to 5d disposed in a vertically divided manner. Each of the sub-modules 5a to 5d corresponds to each channel.

The optical fiber unit 8 is made in the form of a tape in which four optical fibers are being brought together, and each optical fiber forms a transmitting and receiving optical transmission line by multiple-wavelength.

Figure 3:
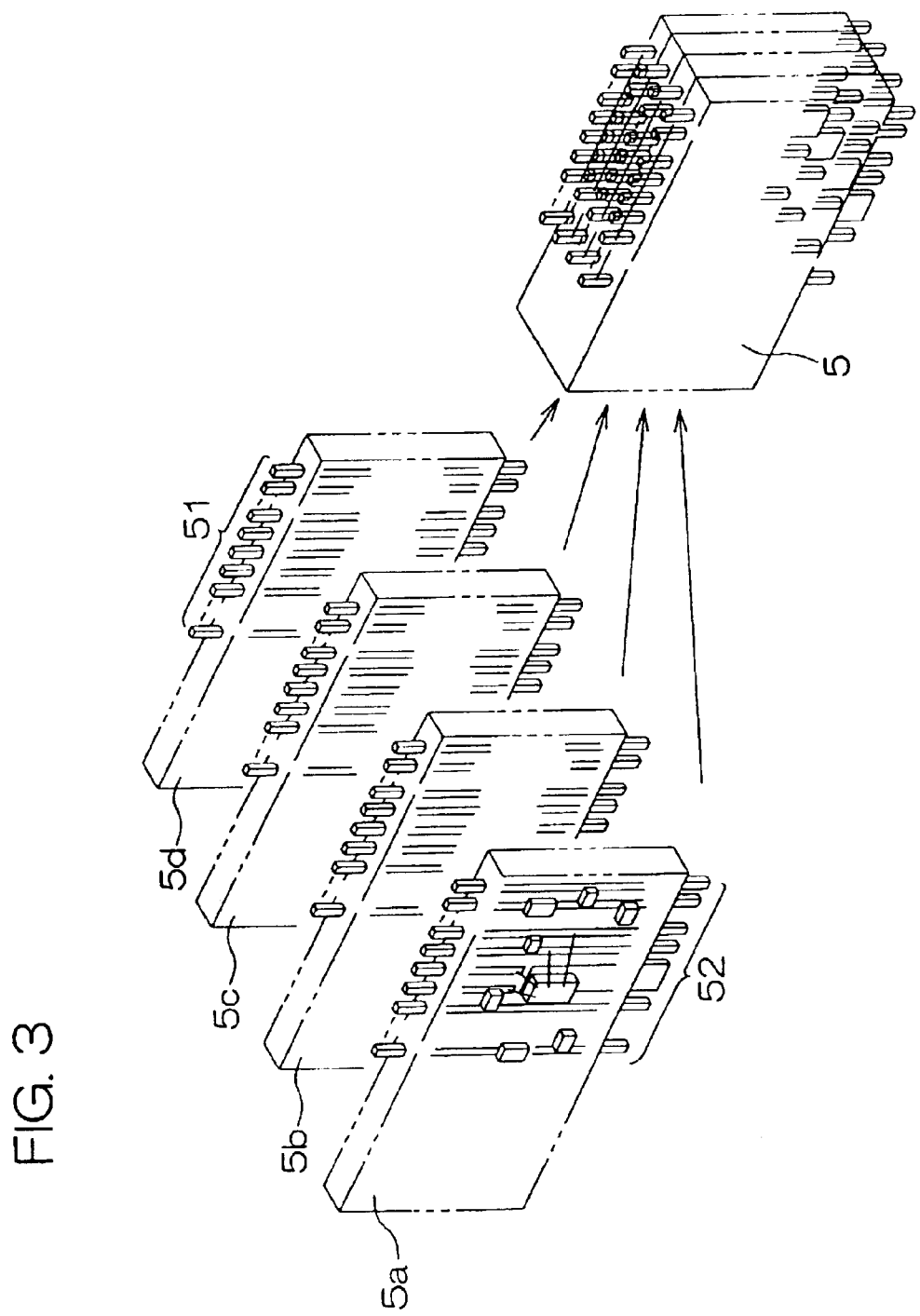
FIG. 3 is an exploded perspective view of a rear module 5 comprising sub-modules 5a to 5d.

FIG. 3 is an exploded perspective view of the rear module 5. The rear module 5 is formed by the four sub-modules 5a to 5d which are placed one upon another. Each of the sub-modules 5a to 5d has a lead frame or the like on which there are mounted electric circuit elements such as ICs, resistors, capacitors and the like, and is subjected to transfer-molding with resin. Terminals 51, 52 of the lead frames or the like are vertically exposed. These terminals 51, 52 of the lead frames or the like are inserted into, and soldered and fixed to predetermined holes in the transmitting and receiving circuit boards 2, 3.

Figure 4:
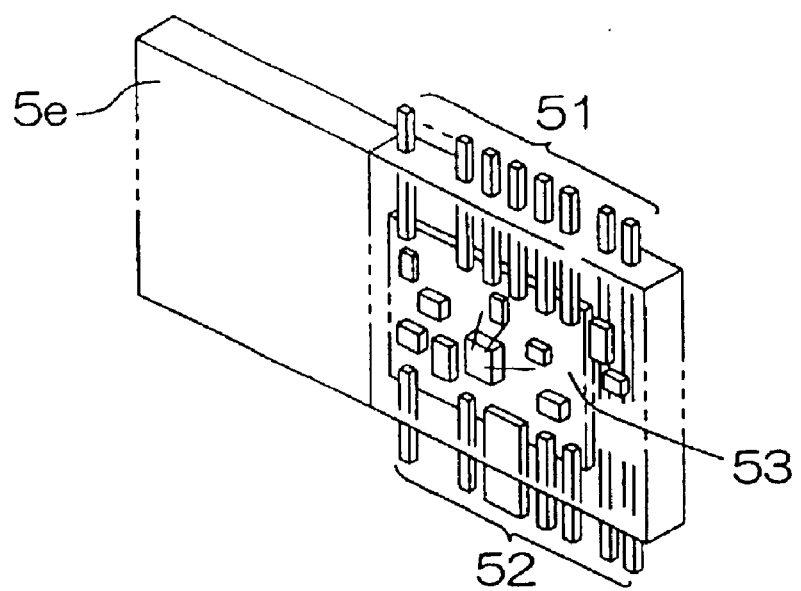
FIG. 4 is a perspective view of a sub-module 5e of another type.

FIG. 4 is a perspective view of a sub-module 5e of another type. An internal board 53 on which elements are being mounted, is connected to the sub-module 5e with a lead frame or the like. The sub-module 5e is subjected to transfer-molding with resin, and terminals 51, 52 of the lead frame or the like are exposed. Instead of each of the sub-modules 5a to 5d, the sub-module 5e of this type may be used.

According to the arrangement above-mentioned, the optical transmitting and receiving circuit unit 1 comprises the transmitting and receiving circuit boards 2, 3, and the front and rear modules 4, 5 tightly held therebetween, and therefore can perform (1) a function of converting an input electric signal into an optical signal or converting, into an optical signal, an input electric signal after modulated in the unit 1, and (2) a function of converting a received optical signal into an electric signal or demodulating a received optical signal after converted into an electric signal in the unit 1.

According to the present invention, by the transmitting and receiving circuit boards 2, 3 and the modules 4, 5 held therebetween, the optical transmitting and receiving circuit unit 1 can realize high-density mounting with neither connectors nor cables used. The wiring length can be minimized because neither connectors nor cables are used. This provides a small and economical electric circuit unit excellent in characteristics.

Figure 5:
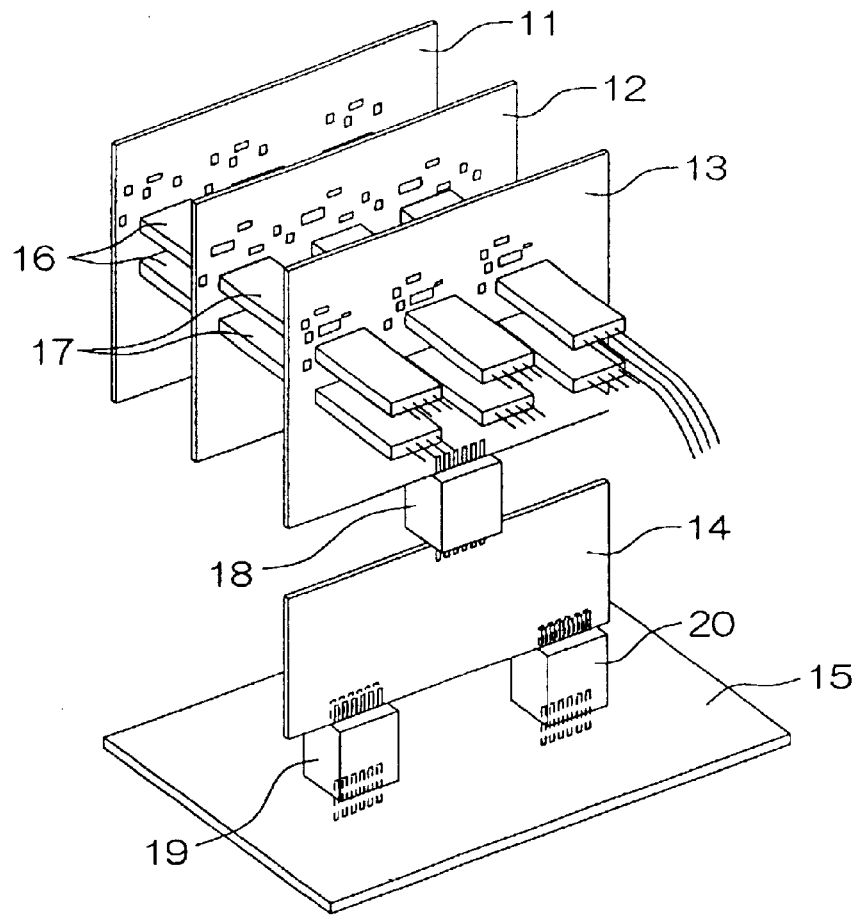
FIG. 5 is a perspective view of an electric circuit unit according to another embodiment of the present invention.

FIG. 5 is a perspective view of an electric circuit unit according to another embodiment of the present invention. According to this embodiment, three parallel circuit boards 11, 12, 13 are connected to one another by modules 16, 17.

Out of these boards 11, 12, 13, the circuit board 13 is connected to another circuit board 14 by a module 18. This circuit board 14 is further connected, by modules 19, 20, to another circuit board 15 disposed at a right angle to the circuit board 14.

Figure 6:
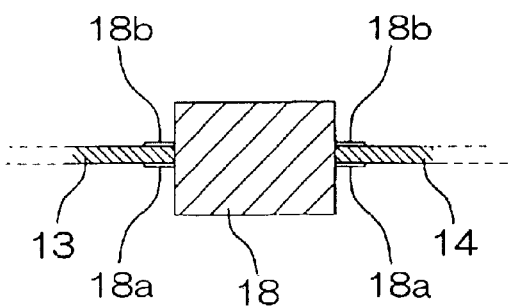
FIG. 6 is a transverse section view of the connection structure of a module 18 for connecting parallel circuit boards to each other

FIG. 6 is a transverse section view of the connection structure of the module 18 for connecting parallel circuit boards to each other. Terminals 18a, 18b of lead frame or the like exposed from the module 18 are so resilient as to hold the circuit boards 13, 14 therebetween. The circuit boards 13, 14 are then soldered and fixed. The circuit board 14 is connected to the module 19, 20 in a similar manner.

Thus, by connecting a plurality of parallel and orthogonal circuit boards 11 to 15 to one another by the modules 16 to 19, a three-dimensional arrangement can be achieved, thus realizing higher-density mounting.

Figure 7:
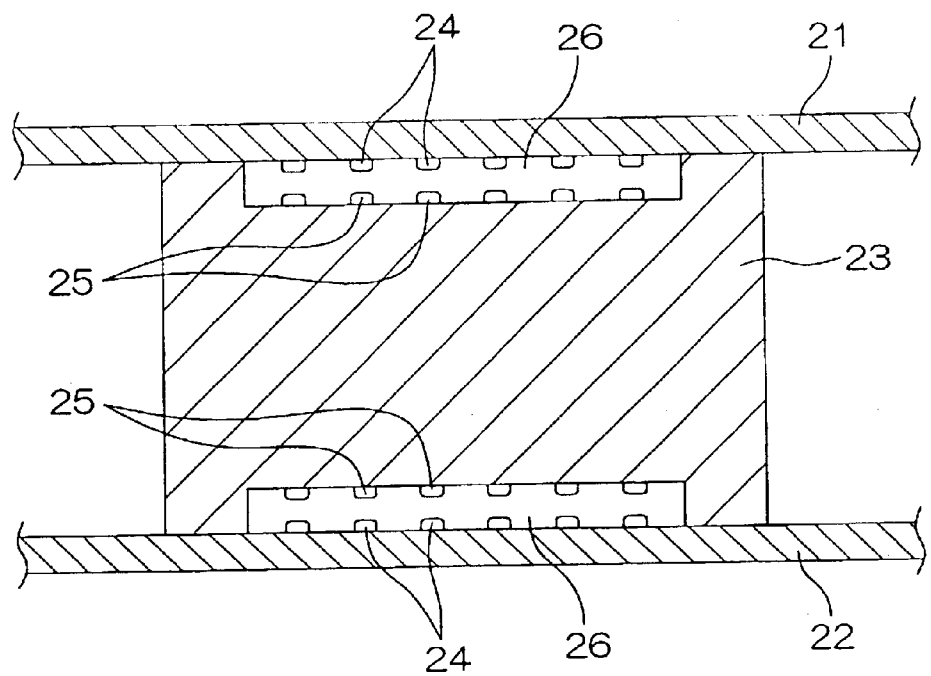
FIG. 7 is a section view illustrating a structure in which two parallel circuit boards 21, 22 are optically connected to each other by a module 23.

In the discussion above-mentioned, the connection between circuit boards and a module, is an electric connection using terminals of the lead frame or the like exposed from the module. However, an optical connection structure may also be adopted. FIG. 7 is a section view illustrating an example in which two parallel circuit boards 21, 22 are optically connected to each other by a module 23.

Light emitting elements and/or light receiving elements 24 are mounted on the circuit boards 21, 22. The module 23 is provided in the connection end face thereof with a concaved space 26, in which there are disposed light receiving elements and/or light transmitting elements 25 corresponding to the light emitting elements and/or light receiving elements 24 of the circuit boards 21, 22.

The module 23 is disposed at a predetermined position between the circuit boards 21, 22 and fixed thereto with screws or adhesives. This causes the corresponding elements 24 and elements 25 to be opposite to each other, thus enabling optical connection to be made. Preferably, the concaved space 26 is sealed with a transparent resin to prevent dust or dirt from entering into the optical path.

Figure 8:
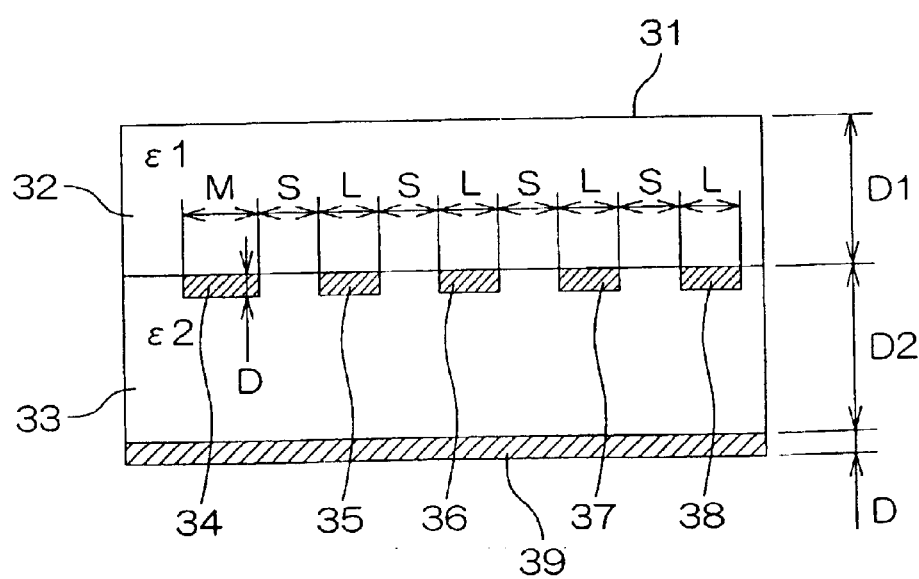
FIG. 8 is a section view of a module 31 in which electric signal wirings are being disposed.

The following will discuss the setting of characteristic impedance of electric signal wirings in a module. FIG. 8 is a section view of a module 31. Upper and lower dielectric layers 32, 33 are disposed inside of the module 31. Conductors 34 to 38 serving as electric signal wirings are disposed between the dielectric layers 32, 33. The signal transmission direction is vertical to the paper plane. A grounding conductor 39 is laminated on the entire lower surface of the dielectric layer 33.

Out of the conductors 34 to 38 disposed between the layers, two conductors 35, 37 are disposed for differential signals (±), and the other conductors 34, 36, 38 are grounded conductor.

Now, the conductor width of the conductor 34 is referred to as M, the conductor width of each of the conductors 35 to 38 is referred to as L, the conductor interval is referred to as S, the thickness of each of the conductors 34 to 38 is referred to as D, the relative dielectric constant of the upper dielectric 32 is referred to as $\in 1$, the thickness of the upper dielectric 32 is referred to as D1, the relative dielectric constant of the lower dielectric 33 is referred to as $\in 2$, and the thickness of the lower dielectric 33 is referred to as D2.

The following conditions are now supposed:

$M=1.4$ mm, $\in 1=4.0$, $\in 2=3.9$, $D=0.15$ mm, $D1=1.5$ mm, $D2=1.25$ mm

With the conductor width L and the conductor interval S used as parameters, the characteristic impedance values of the electric signal wirings were calculated.

Table 1 shows the combinations of the conductor width L and the conductor interval S used as parameters.

TABLE 1

| Pitch (mm) | L & S (mm) | | L & S (mm) | | L & S (mm) | | L & S (mm) | | L & S (mm) | |
|---|---|---|---|---|---|---|---|---|---|---|
| S + L | S | L | S | L | S | L | S | L | S | L |
| Type 1  0.40 | 0.20 | 0.20 | 0.25 | 0.15 | * | * | * | * | * | * |
| Type 2  0.50 | * | * | 0.25 | 0.25 | 0.30 | 0.20 | 0.35 | 0.15 | * | * |
| Type 3  0.60 | * | * | 0.25 | 0.35 | 0.30 | 0.30 | 0.35 | 0.25 | 0.40 | 0.20 |

For the type 1 in which the pitch L+S is equal to 0.4 mm, calculations were made for the cases where S=0.20 mm and L=0.20 mm and where S=0.25 mm and L=0.15 mm.

For the type 2 in which the pitch L+S is equal to 0.5 mm, calculations were made for the cases where S=0.25 mm and L=0.25 mm, where S=0.30 mm and L=0.20 mm, and where S=0.35 mm and L=0.15.

For the type 3 in which the pitch L+S is equal to 0.6 mm, calculations were made for the cases where S=0.25 mm and L=0.35 mm, where S=0.30 mm and L=0.30 mm, where S=0.35 mm and L=0.25 mm, and where S=0.40 mm and L=0.20 mm.

Table 2 shows the calculation results of characteristic impedance values in ohm ($\Omega$).

TABLE 2

| | Conductor Interval S (mm) | | | | |
|---|---|---|---|---|---|
| | 0.2 | 0.25 | 0.3 | 0.35 | 0.4 |
| Type 1 (pitch 0.40 mm) | 45.56 | 53.37 | | | |
| Type 2 (pitch 0.50 mm) | | 48.8 | 55.41 | 62.19 | |
| Type 3 (pitch 0.60 mm) | | 45.7 | 51.1 | 56.76 | 62.64 |

Figure 9:
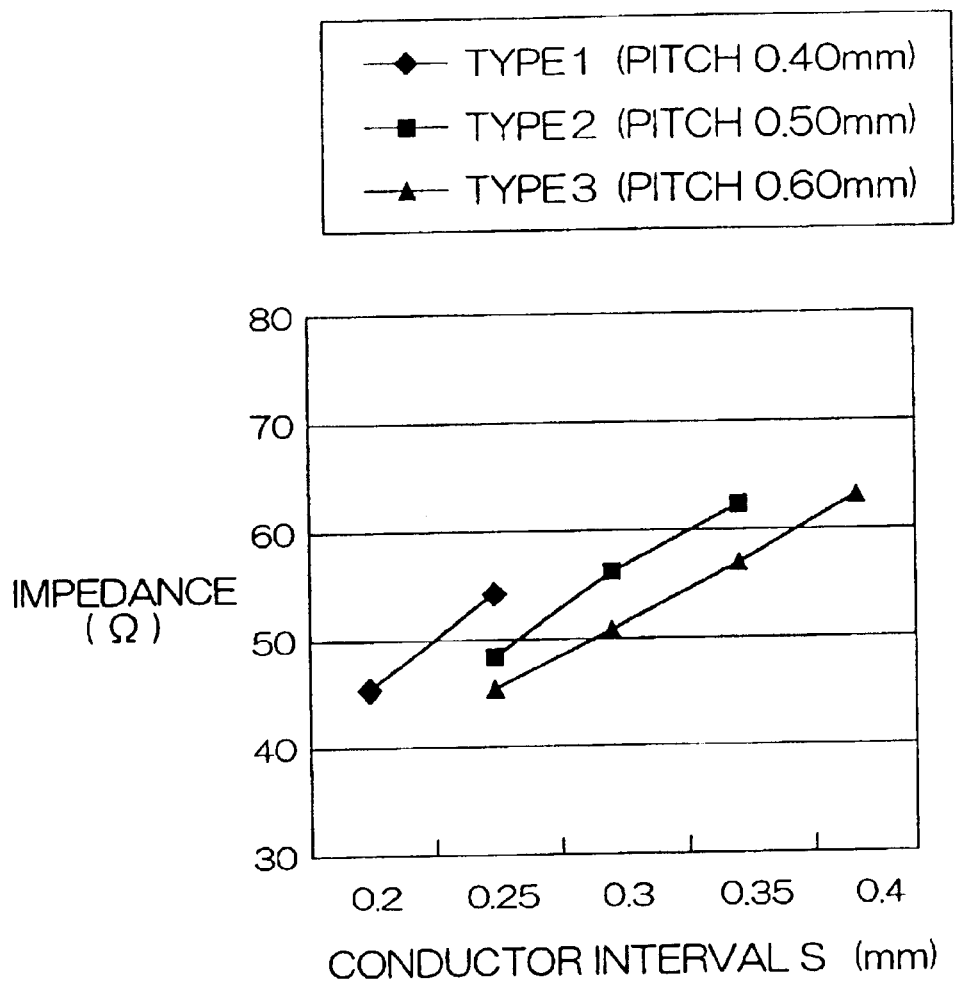
FIG. 9 is a graph illustrating the calculation results of characteristic impedance.

FIG. 9 is a graph illustrating the calculation results of Table 2. It is understood from this graph that the target impedance (50$\Omega$) can be obtained for any of the types 1, 2, 3 by adjusting the conductor interval S.

Thus, embodiments of the present invention have been discussed. However, the present invention should not be limited only to the embodiments above-mentioned. For example, each module may be provided, on its end face not connected to any of the circuit boards, with a connector of a coaxial cable for achieving an electric connection with an external device, instead of an optical connector for achieving an optical connection with an external device. Various modifications may also be made within the scope of the invention.

What we claim is:

1. An optical transmitting and receiving circuit unit used for conversion between an electric signal and an optical signal in an electric/optical information communication unit comprising:

a plurality of circuit boards disposed at optional angles; and a first module on which an electric circuit element and an optical circuit element for a plurality of channels are mounted, and which have conversion function between electric and optical signals, a second module on which an electric circuit element for a plurality of channels is mounted, and which has input/output interface function between transmitting and receiving signals, said first module being provided, on its end face not connected to any of said circuit boards, with an optical connection structure for connecting said first module to an external device, said first and second modules being bonded to each of two or more circuit boards selected from said plurality of circuit boards, said second module being connected and fixed to each of said two or more circuit boards through an electric connection terminal between said two or more circuit boards.

2. An optical transmitting and receiving circuit unit according to claim 1, wherein said first module is provided, on its end face having said optical connection structure for connecting said module to an external device, with a plurality of optical connection structures for connecting said module to external devices, respectively.

3. An optical transmitting and receiving circuit unit according to claim 1, wherein said circuit boards are disposed at an angle 0° (parallel) or 90° (orthogonal) with respect to one another.

4. An optical transmitting and receiving circuit unit according to claim 1, wherein the characteristic impedance of the electric signal wirings inside of said module is set to 50$\Omega$.

5. An optical transmitting and receiving circuit unit used for conversion between an electric signal and an optical signal in an electric/optical information communication unit comprising:

a plurality of circuit boards disposed at optional angles; and a first module on which an electric circuit element and an optical circuit element for a plurality of channels are mounted, and which have conversion function between electric and optical signals, a second module on which an electric circuit element for a plurality of channels is mounted and which has input/output interface function between transmitting and receiving signals, said first module being provided, on its end face not connected to any of said circuit boards, with an optical connection structure for connecting said first module to an external device, said first and second modules being bonded and fixed to each of two or more circuit boards selected from said plurality of circuit boards, said first module having an optical connection structure between said two or more circuit boards.

6. An optical transmitting and receiving circuit unit according to claim 5, wherein said first module is provided, on its end face having said optical connection structure for connecting said module to an external device, with a plurality of optical connection structures for connecting said module to external devices, respectively.

7. An optical transmitting and receiving circuit unit according to claim 5, wherein said circuit boards are disposed at an angle 0° (parallel) or 90° (orthogonal) with respect to one another.

8. An optical transmitting and receiving circuit unit according to claim 5, wherein the characteristic impedance of the electric signal wirings inside of said module is set to 50Ω.

9. An optical transmitting and receiving circuit unit used for conversion between an electric signal and an optical signal in an electric/optical information communication unit comprising:

a plurality of circuit boards disposed at optional angles; and a first module on which an electric circuit element and an optical circuit element for a plurality of channels are mounted, and which have conversion function between electric and optical signals, a second module on which an electric circuit element for a plurality of channels is mounted, and which has input/output interface function between transmitting and receiving signals, said first module being provided, on its end face not connected to any of said circuit boards, with an optical connection structure for connecting said first module to an external device, said first and second modules being bonded and fixed to each of two or more circuit boards selected from said plurality of circuit boards, said first module having an optical connection structure and said second module having an electric connection structure between said two or more circuit boards.

* * * * *